United States Patent [19]
Szalma et al.

[11] Patent Number: 5,164,670
[45] Date of Patent: Nov. 17, 1992

[54] MULTIDIMENSIONAL MAGNETIC RESONANCE SYSTEM USING SELECTIVE DISCRETE FOURIER TRANSFORMATION (SDFT)

[75] Inventors: Sandor Szalma, Szeged, Hungary; Istvan Pelczer, Syracuse, N.Y.

[73] Assignee: Syracuse University, Syracuse, N.Y.

[21] Appl. No.: 583,914

[22] Filed: Sep. 17, 1990

[51] Int. Cl.$^5$ .......................................... G01R 33/20
[52] U.S. Cl. .......................................................... 324/309
[58] Field of Search ............... 324/300, 307, 309, 310, 324/311, 312, 313, 314; 128/653 R, 653 A

[56] References Cited

U.S. PATENT DOCUMENTS 4,703,270 10/1987 Hall et al. ............................ 324/309
5,027,072 6/1991 Rinaldi ................................. 324/312

OTHER PUBLICATIONS

G. Goertzel, American Mathematics Monthly, 65, 34(1958).
B. Blumich, Progress in NMR Spectroscopy 19, 331–417 (1987).

Primary Examiner—Michael J. Tokar
Attorney, Agent, or Firm—M. Lukacher

[57] ABSTRACT

Magnetic resonance data is generated as a set of digital signals in the time domain. Each signal represents a multiplicity of parameters (for example two or three dimensions in the frequency domain). Transformation of such multiparameter (multidimensional) time domain signals into the frequency domain to provide multidimensional spectra (in frequency or in space for resonance imaging) utilizes discrete Fourier transformation in a spectral region of interest by calculating matrix products of data points corresponding to successively spaced values of the time domain signal in sequence with data signals corresponding to successive frequency points to obtain the output spectra. To increase the efficiency of the calculations "zero padding" may be accomplished directly in the frequency domain reconstructing more or less data points there than the corresponding number of the acquired time domain points, to increase or decrease digital resolution. Small information rich regions of the spectra (e.g., 2D and 3D NMR spectra) may be produced, without reconstruction of the other part of the spectra, directly from the time domain data, with no intermediate transposition step, and greatly reduced computational resources (e.g., disk input/output (I/O)).

16 Claims, 9 Drawing Sheets

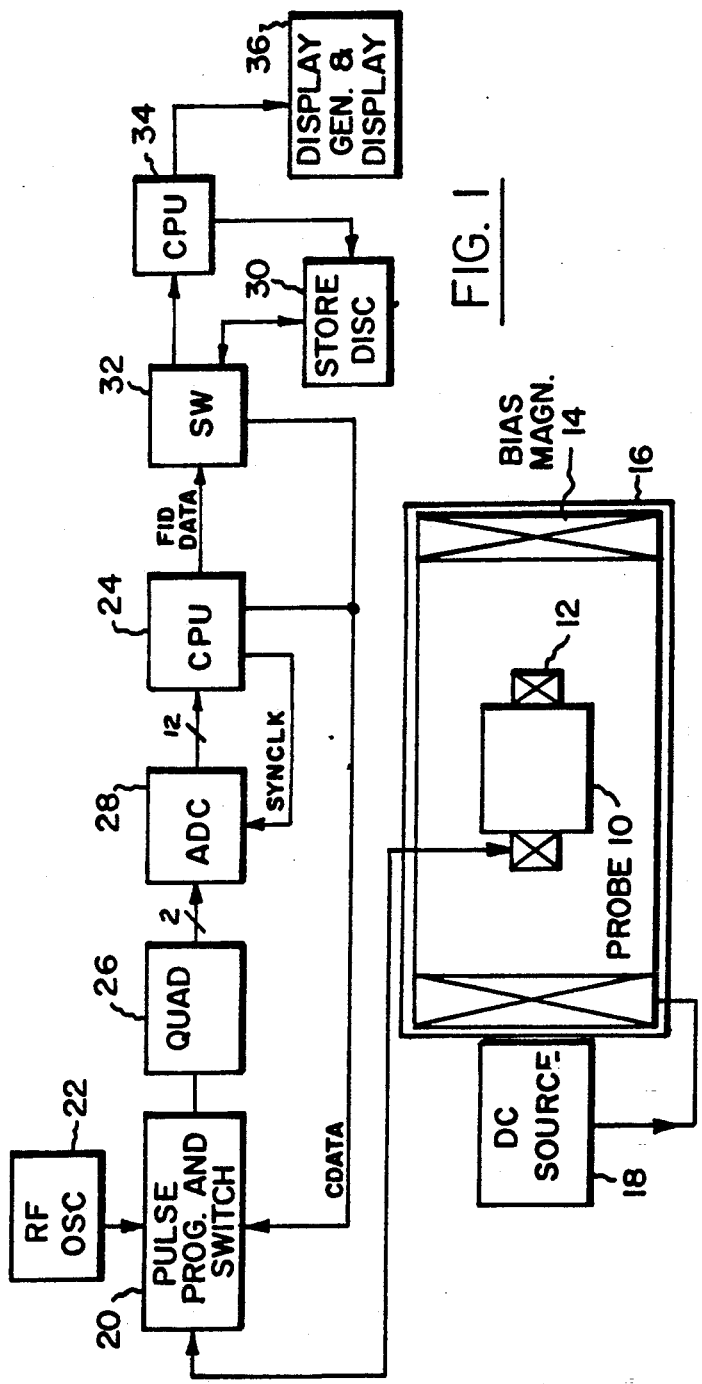
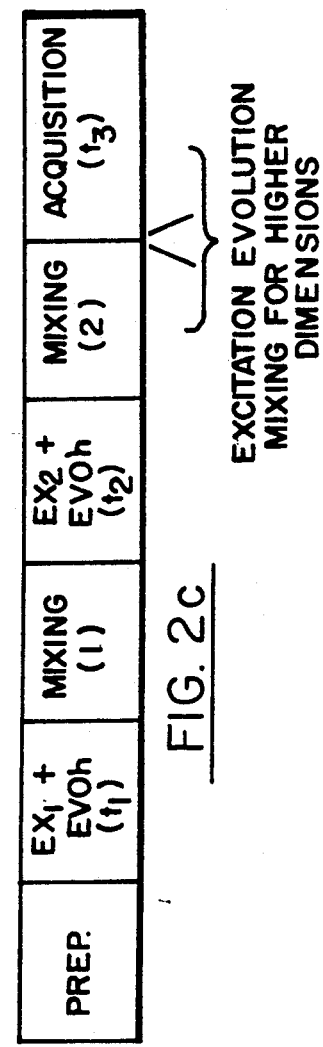
FIG. 1
FIG. 2c

MULTIDIMENSIONAL MAGNETIC RESONANCE SYSTEM USING SELECTIVE DISCRETE FOURIER TRANSFORMATION (SDFT)

DESCRIPTION

The present invention relates to a system (method and apparatus) for translating multiparameter (multidimensional) magnetic resonance signals into frequency domain (spectral) signals thereby constructing the spectrum from the magnetic resonance signals. The invention relates particularly to a multiparameter (multidimensional) magnetic resonance system using discrete Fourier transformation to obtain or estimate a multidimensional spectrum from time domain signals only in selected regions of the frequency space.

The invention is especially suitable for obtaining spectra of continuous, multiparameter (multidimensional) NMR signals. The invention may be also used for obtaining the spectra of signals obtained with other magnetic resonance techniques such as ion cyclotron resonance (ICR) and stochastic NMR spectroscopy. The invention is also useful in NMR imaging of multidimensional objects, since an analogy exists between the space parameters of the NMR image signals and the evolution time parameters in multidimensional magnetic resonance spectroscopy (i.e., x, y, z, $=t_1,t_2,t_3$).

A two-dimensional NMR signal which is applied to and detected from an NMR probe is shown in FIG. 2(a). The cycle starts with a preparation time to enable recycling delay between the generation of successive signals. This delay may typically be about two seconds. Then there is short excitation pulse, or pulse sequence, depending upon the nuclear characteristic of interest. This pulse may typically be 10-microseconds in duration. There follows and evolution time $t_1$. This time is varied or stepped on successive cycles and evokes the first dimension of the spectra. There follows a mixing period, usually consistent of a pulse or pulses, which effects in the illustrated case, a "spin lock time." This period is typically 30 milliseconds. Thereafter the signal evolves. The evolution of the signal occurs in the free induction delay (FID) time $t_2$. This time is another variable in the NMR signal. The signal is acquired, and called the free induction decay (FID) over the $t_2$ time interval. This $t_2$ interval typically varies from 100 to 800 milliseconds. The two-dimensional NMR cycle of FIG. 2(a) is simplified, since the data acquisition, also in $t_1$ is generally applied in quadrature and results in real and imaginary components. These components may occur successively for each phase of the exciting pulse which is indicated as $e_{0°}$ and $e_{90°}$. There are therefore four parts; two pair of real and imaginary parts in the detected signal. These are labeled $R_{t1}$ and $I_{t1}$ in FIG. 2(b). Thus, as the evolution period is stepped, there will be four signals which vary in time and correspond to a two-dimensional (2D) NMR signal.

FIG. 2(c) illustrates, schematically, a three-dimensional and higher dimensional signals. This signal evokes three dimensions by virtue of the second excitation signal $EX_2$ and a variable $t_2$. Both $t_1$ and $t_2$ are stepped and evoke the three-dimensional signal $t_3$. In the event of a phase sensitive three-dimensional signal, there will be provided, eight sets of free induction decay (FIDs), thereby doubling the signals shown in FIG. 2(b). As shown in FIG. 2(d), the FID signals change as $t_1$ is stepped with respect to $t_2$ as in the case of a 3D signal and there is still a third dimension. The amount of data the data sets obtained by digitizing the time domain data such as shown in FIG. 2(d) is huge. Construction of spectra for high resolution multidimensional spectroscopy from such data taxes computational resources of available computers, even computers known as super computers.

Fast Fourier Transform (FFT) algorithms have been used to compute the spectra. However, working with multidimensional NMR data requires manipulation of data sets in the gigabyte range which poses serious practical problems.

It has been observed however, that upon increasing the number of dimensions, the desired spectral information occupies relatively less of the frequency domain; much of the frequency domain data containing no scientifically useful information. Compressing the data can reduce central processing unit (CPU) in data storage requirements. However, huge amounts of data must flow into the compression process. The speed of the processing then becomes limited by the input/out (I/0) capacity of the storage system, usually a disk storage device.

In accordance with the invention, rather than utilizing FFT algorithms in processing the time domain data to obtain the spectra, frequency selective discrete Fourier transformation is used to generate spectra only in regions of interest, particularly small information-rich regions of the spectrum. No intermediate transposition steps are required as usually in the case of FFT processing, thereby reducing the demands on the I/O from storage. This frequency-selective approach of discrete Fourier transformation is herein called Selective Discrete Fourier Transformation (SDFT). In addition to developing limited frequency domain spectral data, the digital resolution of the spectra in the region of interest can be enhanced with much higher freedom and flexibility.

The SDFT system has several advantages over other Fourier transform techniques. The need for transposition is avoided; specifically, as the computation proceeds through multiplication of each FID with partial trigonometric matrixes without intermediate storage steps. Another advantage is that SDFT enables independent reconstruction of subvolumes/subregions of the original, or of any lower dimensionality (i.e., slices and projections) of the multidimensional spectra. It is still another advantage is facility for "zero filling" within the selected spectral ranges (i.e. in the frequency domain), rather than in the time domain through manipulation of the FID signals. Similarly the frequency signals (these signals are in trigonometric matrixes), each corresponding to a successive frequency in each dimension, may be phase corrected and first point corrections as well apodization (modification of the spectra with weighting functions) may be handled on the frequency point data in the matrixes. Another feature of SDFT is that the data signals values need not be integral powers of two, as is the case for FFT algorithms.

The SDFT enables individual frequency domain points S ($w_1$, $w_2$, . . .) to be calculated directly from the time domain (FID) data I ($t_1$, $t_2$, . . . ). In order to calculate the spectrum (the frequency domain points) matrix multiplication is used with trigonometric submatrixes to provide the frequency points. It will be appreciated that all the signals are data signals in digital form where in a byte (for example eight or twelve bits) represents the digital value of a successive (in time) time domain signal or a successive frequency in each dimension. For example, in 2D computation the resulting spectrum may be expressed as:

$$S(w_1, w_2) = B(w_1, t_1)\{A(w_2, t_2)I(t_2, t_1)\}^T \quad (1)$$

where $a_{jk} = \exp(-iw_2^j t_2^k)$ and $b_{jk} = \exp(-iw_1^j t_1^k)$ in more detail A and B have the structure shown below:

$$\left\{\begin{pmatrix} a_{l1} & \cdots & a_{ln} \\ \vdots & & \vdots \\ \boxed{a_{c1} \cdots a_{cn}} \\ \vdots & & \vdots \\ \boxed{a_{d1} \cdots a_{dn}} \\ \vdots & & \vdots \\ a_{q1} & \cdots & a_{qn} \end{pmatrix} \begin{pmatrix} b_{l1} & \cdots & b_{lm} \\ \vdots & & \vdots \\ \boxed{b_{f1} \cdots b_{fm}} \\ \vdots & & \vdots \\ \boxed{b_{g1} \cdots b_{gm}} \\ \vdots & & \vdots \\ b_{p1} & \cdots & b_{pm} \end{pmatrix}\right\} \quad (2)$$

where $t_1$ and $t_2$ are digitized over m and n points, and $w_1$ and $w_2$ over p and q points, respectively. p does not have to be equal to m nor does q have to be equal to n. The points in the matrixes which are used for selectivity are c to d and $w_2$ and f to g and $w_1$, shown boxed in the expression above. These correspond to a small region of interest in $S(w_1, w_2)$. The spectrum in both dimensions is calculated independently of all the other regions in the frequency domain. The boxed regions in the matrix expression correspond to reduce trigonometric matrixes, $A^r B^r$. By using the transposition represented by the T in the first equation, most of the I/O can be eliminated. For example, B is generated with a 90° transposition as $B^{rT}$. Therefore, $S_t$ equals $\{A^rI\} B^{rT}$.

Inasmuch as the digitization in the frequency domain is completely arbitrary, a non-classical "zero filling" may be used within the ranges c to d and f to g as desired, increasing or even decreasing local digital resolution, spacing of reconstructed frequency points may not necessarily be linear. Also there is no requirement for integral powers of two. This liberates the need to generate and handle very large data matrixes by expansion of the overall NMR data set.

In the case of 3D and higher dimensional data, additional trigonometric matrixes need only be used together with successive matrix vector product multiplications. For example, in the 3D case, A, B, C correspond to the matrixes where the A matrix corresponds to $a_{jk} = \exp(-iw_3^k t_3^j)$ and $b_{jk} = \exp(-iw_2^j t_2^k)$ and $c_{jk} = \exp(-iw_1^j t_1^k)$.

Briefly, therefore, in accordance with the invention, the multidimensional spectra are generated by selecting the regions of interest. In certain chemical analyses such regions are known a priori but the detail structure of the regions as can be obtained by NMR spectroscopy is not known and is obtained by the SDFT method of this invention. Then frequency points are generated and stored in a look up table with, if desired, phase correction, resolution and apodization. The points may be phased relative to each other in order to provide clean spectra. Then matrix products for each input (FID) data point is calculated in sequence (i.e. the discrete Fourier transform is generated) to provide a matrix representing the spectra. This matrix may be displayed in graphic form in as many dimensions as the magnetic resonance data which is processed.

The foregoing and other objects, features and advantages of the invention as well as the best mode presently known for practicing the invention will become more apparent from a reading of the following description in connection with the accompanying drawings in which:

FIG. 1 is a block diagram of an NMR system in which the invention is embodied;

FIGS. 2(a), (b), (c), (d), are diagrams of the signals applied and obtained from the NMR probe shown in FIG. 1 and have been discussed above;

Figure 6:
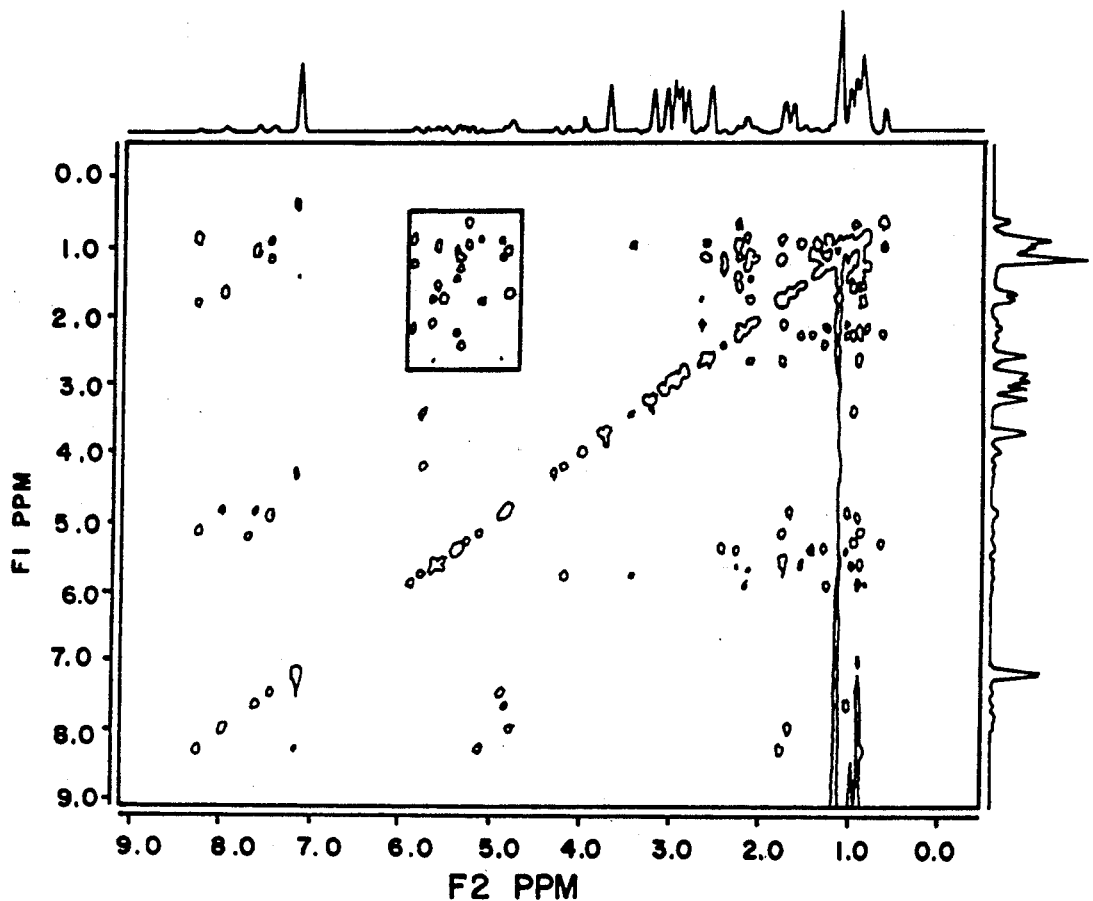
Figure 9:
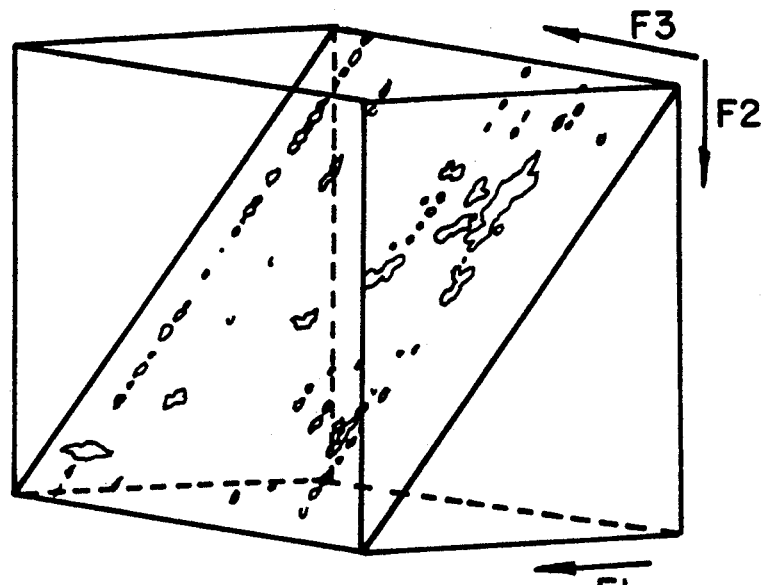
Figure 11:
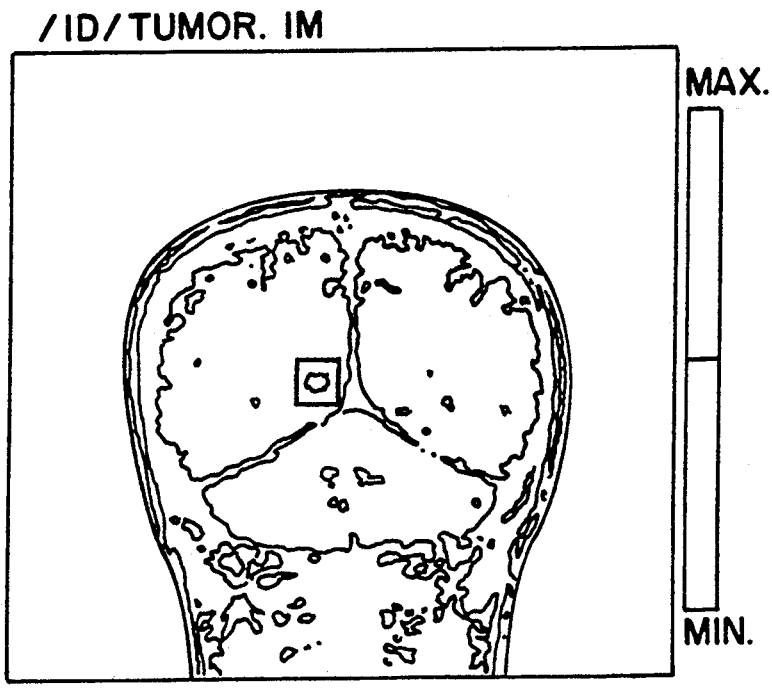
Figure 7:
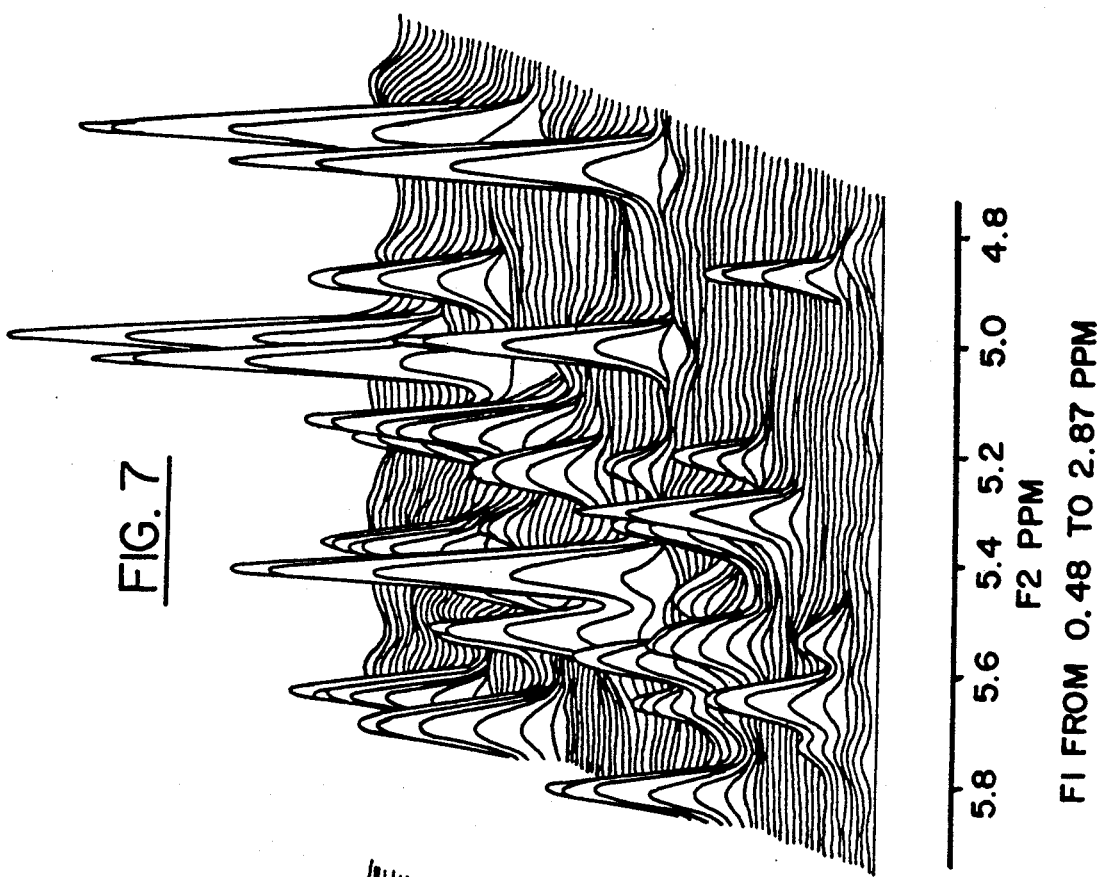
Figure 8:
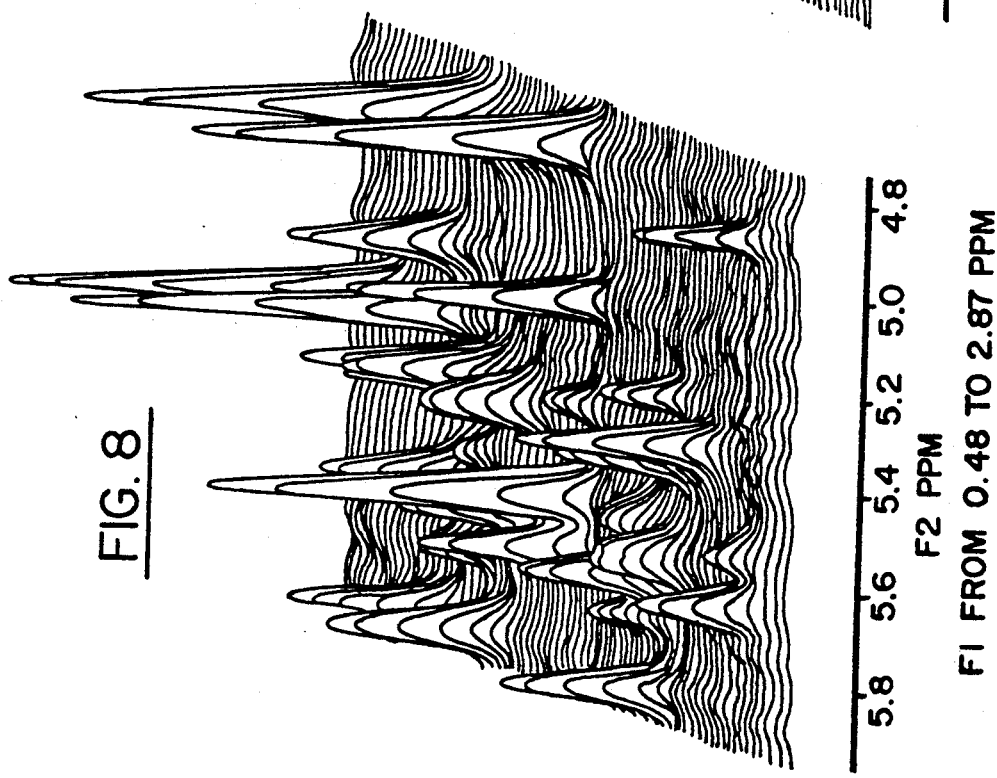
Figure 10:
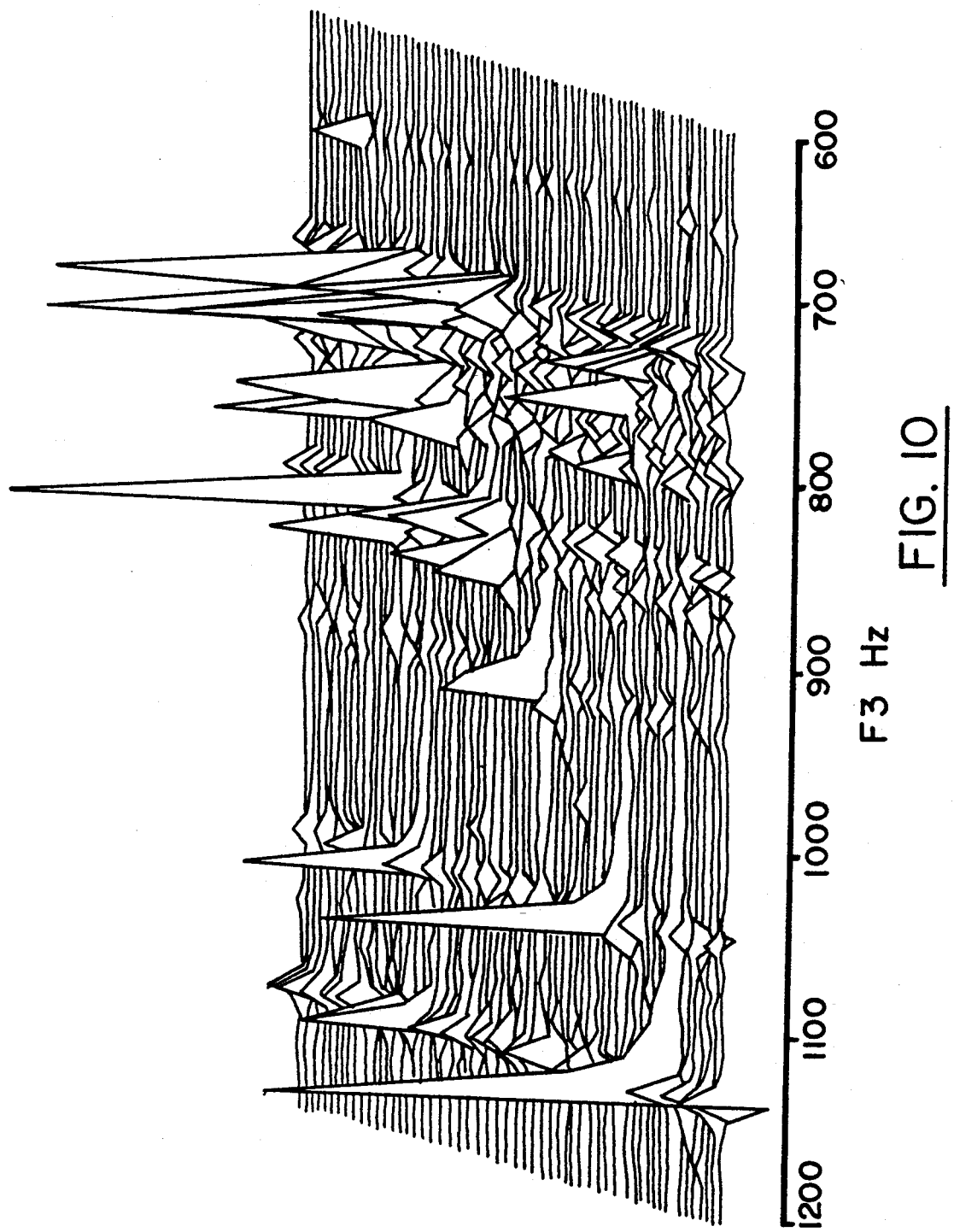

FIG. 6 is an exemplary spectrum obtained from two-dimensional NMR data, particularly the homonuclear spin-lock COSY spectrum of undecapeptide cyclosporin A in $C_6D_6$ ($C_6D_5H = 7.16$ ppm) at 273K. The two-dimensional FID contained 256 complex points in both dimensions, appoizing in the form of cosine cube weighting being applied before zero filling to 1K, the entire spectrum as processed by FFT being shown with the small frame highlighting the region of expansion and application of SDFT, the frequencies F1 and F2 being normalized and expressed in ppm, the tracing on the right and top of the figure being projections of the 2D spectrum on to the F1 and F2 axes, respectively;

FIG. 7 is a stacked plot of the small region shown boxed in FIG. 1 obtained by SDFT, without reconstruction of any other parts of the overall spectrum;

FIG. 8 is a stacked plot of the region shown in FIG. 7 obtained by FFT, and extracted from the overall processed spectrum for comparison, and is identical to the SDFT spectrum shown in FIG. 8;

FIG. 9 is a three-dimensional spectrum from which only a cross-diagonal plane is reconstructed in which F1 equals $F2_o$, the plot being constructed from the 3D ROESY—HOHAHA spectrum of benzanthracene;

FIG. 10 is the stacked plot of the selectively constructed subspectrum (plane) shown in FIG. 9, F3 being calibrated in Hertz, while in the F1 and F2 dimensions, F1 equals F2; and FIG. 11 is an NMR image of a part of anatomy (human brain with a small tumor) showing a boxed area which, may be processed selectively by SDFT in the same manner as the boxed area in FIG. 6.

Figure 2A:
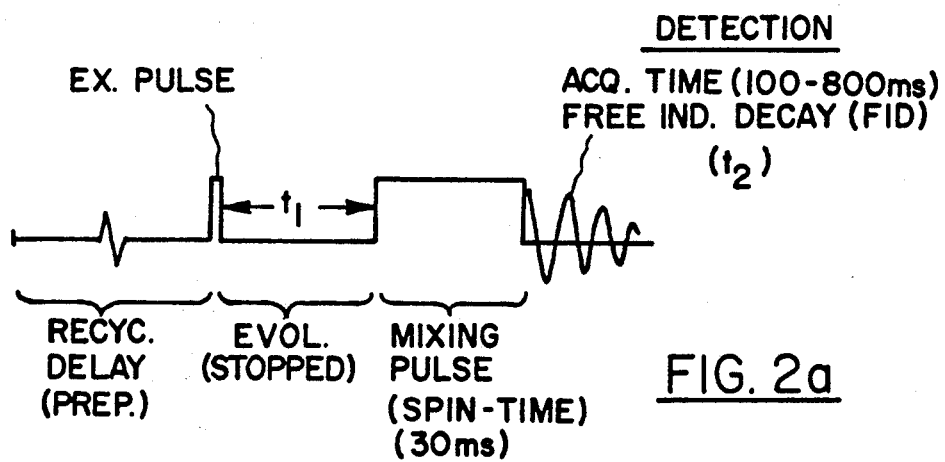
Figure 2B:
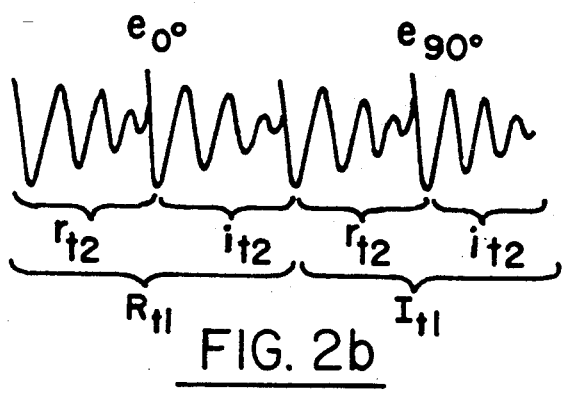

Referring next to FIG. 1 there is shown an NMR system wherein, a probe 10 is in the form of a specimen chamber and is surrounded by an RF coil 12. The probe is disposed within a bias magnet 14. The probe and magnet 14 may be in a cryogenic chamber 16, especially when the magnet 14 is a super conducting magnet. Magnetization is initiated or maintained by DC current from a source 18. The excitation pulses are applied to the coil 12 and derived from the coil in timed relationship by a pulse programmer and switch 20. The pulses are short bursts of RF from an oscillator 22. The pulse programmer is controlled by a first CPU (central processing unit or computer) 24. The computer applies control data (CDATA) to the programmer 20 to switch the signals with the timing required to obtain multidimensional NMR data (by stepping $t_1$ $t_2$, etc.) in successive cycles and with the timing discussed in connection with FIGS. 2(a) and 2(c). The FID signals are acquired during the detection time $t_2$ for 2D data and $t_3$ for 3D data. $t_2$ and $t_3$ are stopped by the CDATA from the CPU 24 which determines the detection times. In the event that quadrature detection is used, the output signals are lead to a quadrature detector 26 system which uses either two detectors for simultaneous, or one with appropriate timing for sequential detection of signals of phase difference by 90° so as to obtain two sets of real and imaginary FID's (see FIG. 2(b)). These FID's are digitized in an analog to digital converter ADC 28 which provides the data signals at successive points in time. Each data signal may be a twelve bit byte. These data signals may be outputted by the control CPU 24 as FID data. The FID data is switched by the control CPU 24 as desired to storage (for example, on storage disc 30) via a control switch 32. When the spectral data is desired, it may be generated either in real time from the FID data or off line from disk 30 or whatever storage unit is used. An analysis CPU 34 processes the data to provide the spectra. This CPU 34 may or may not be a unit, independent from the control CPU 24. These spectra may be displayed on a display which converts the digital data into graphic data. The display is shown at 36 and contains a display generator for digital data to graphics conversion. The NMR system shown in FIG. 1 is generally conventional except for the CPU 34 which is programmed to process the data by SDFT.

Figure 3:
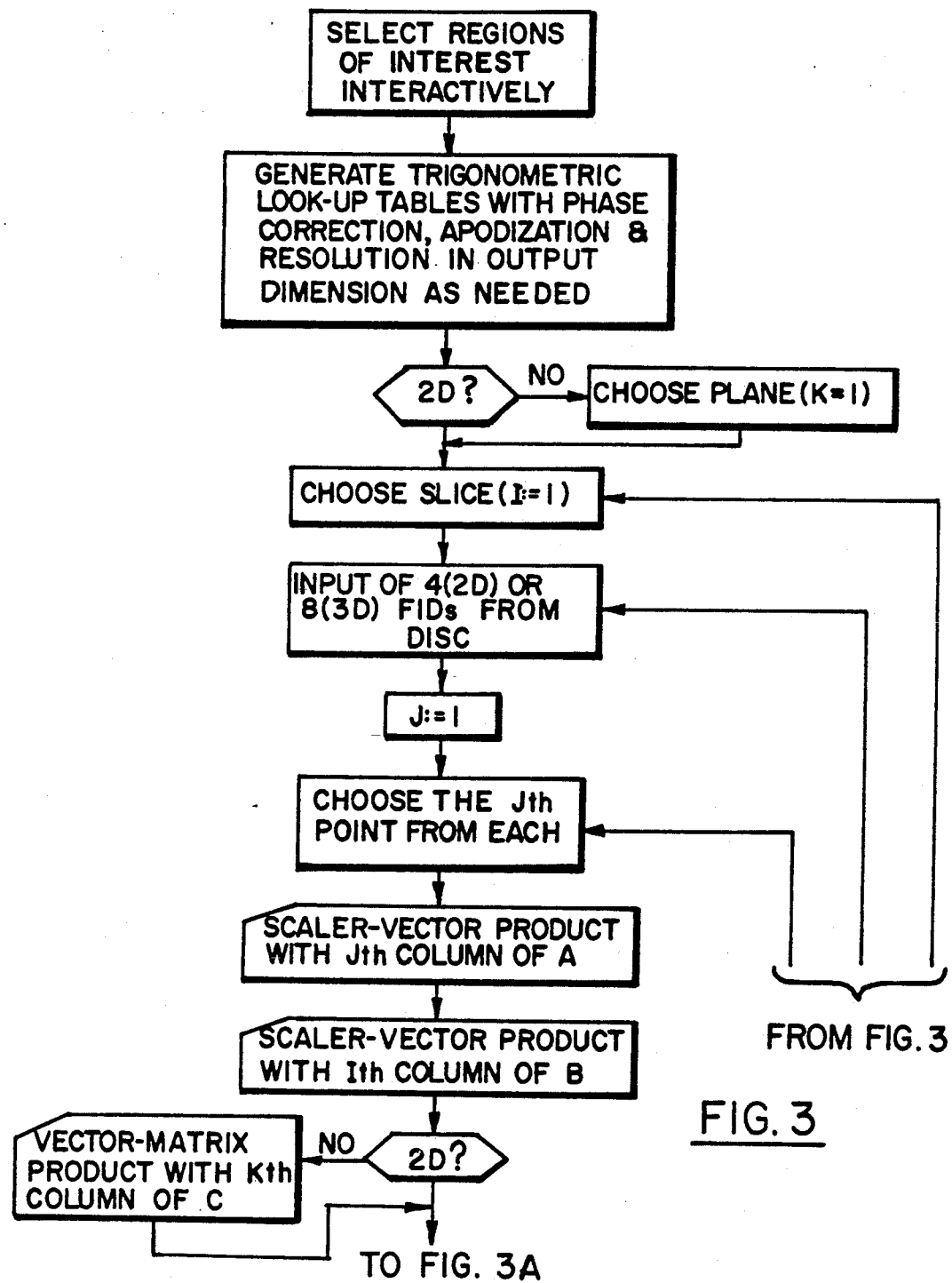
FIG. 3 to 3A is a flow chart illustrating the format and structure of the program in the CPU which produces the spectra from the multidimensional NMR data provided by the operation of the system.
Figure 3A:
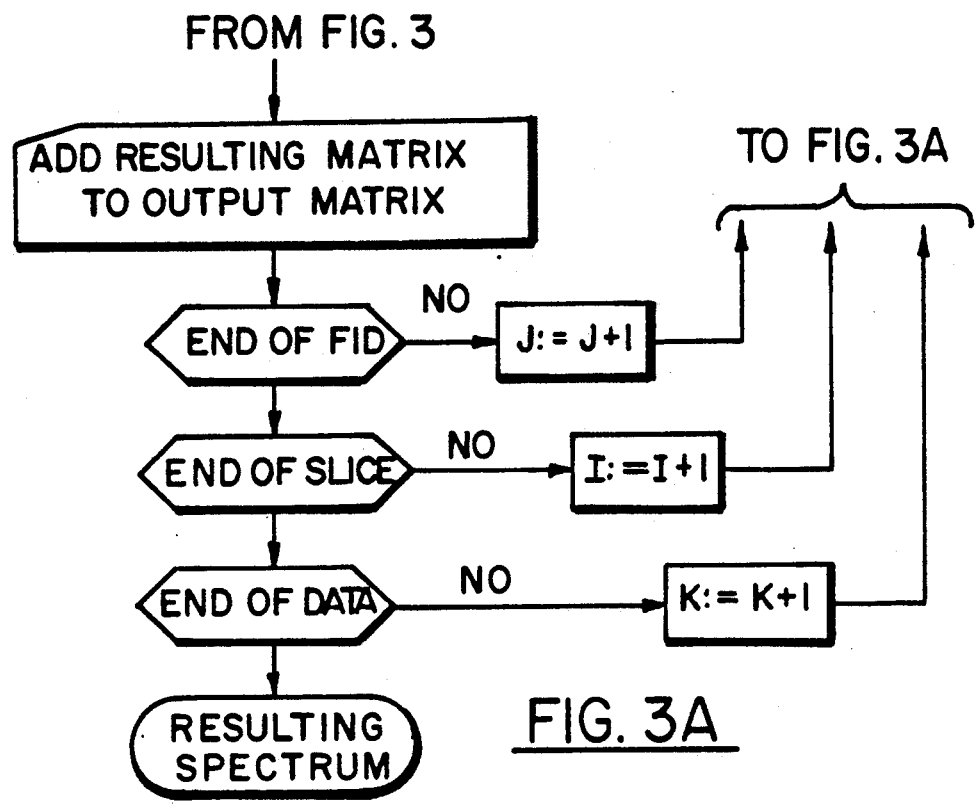
Figure 5:
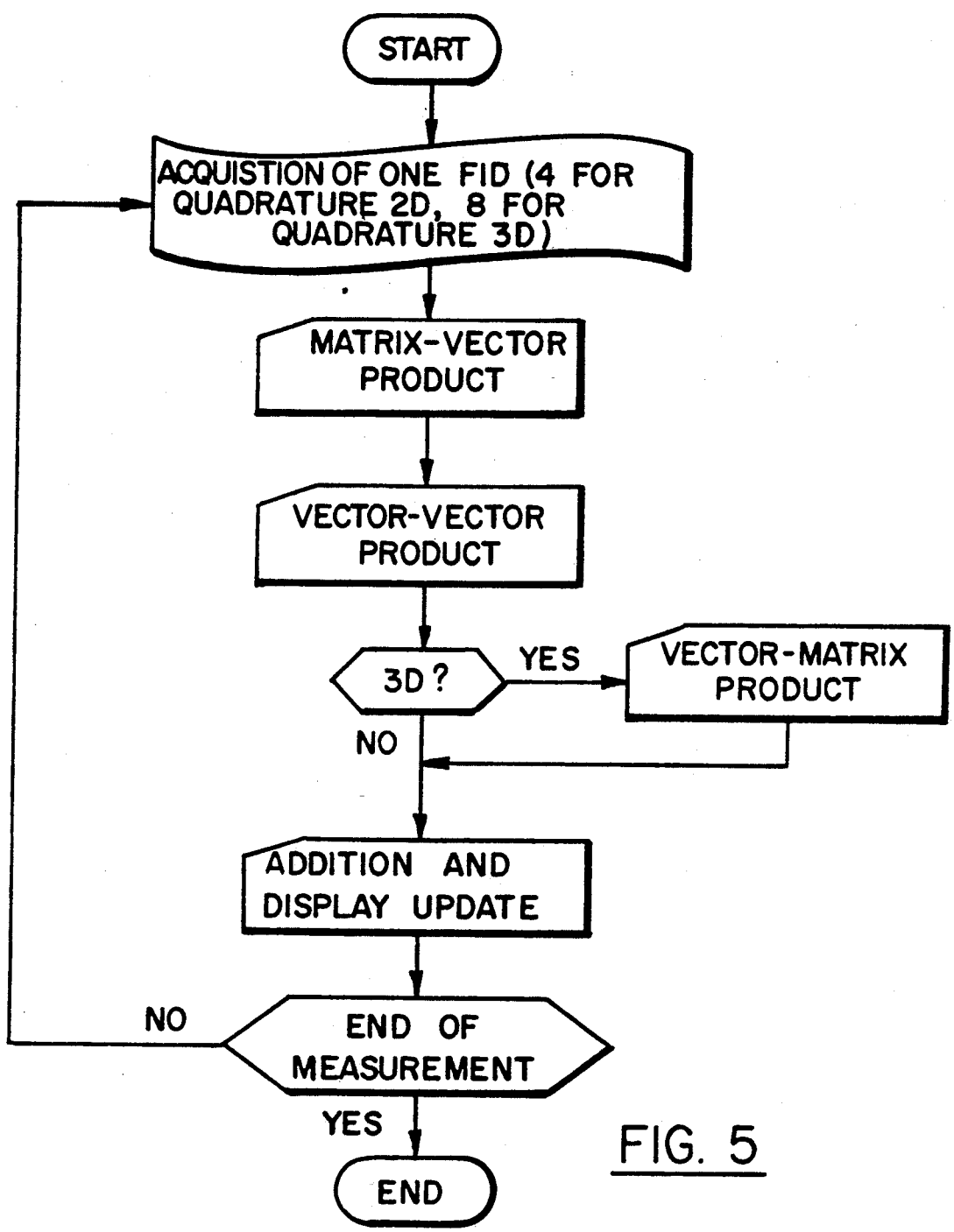
FIG. 5 is a flow chart showing the program for obtaining the spectra in real time.

The SDFT processes are obtained by the program shown in FIG. 3 for the case where the FID data is obtained from disk storage 30. FIG. 5 illustrates a modification in the program for real time acquisition of the data.

Referring to FIG. 3, the region or the regions of the spectrum of interest are inputted by generating trigonometric look up tables. These tables may be changed interactively, while observing the spectrum on the display 36, in order to focus on the regions of interests. The tables are generated with phase correction by varying the relative values of the data signals. Where the data signals correspond to sinusoid their values may be changed to correct their phase. Apodization functions may be applied by changing the values of the frequency point data in accordance with a desired function, such as a weighing function. The number of frequency points in the region determines the resolution and may be increased (or decreased) as needed.

Figure 2D:
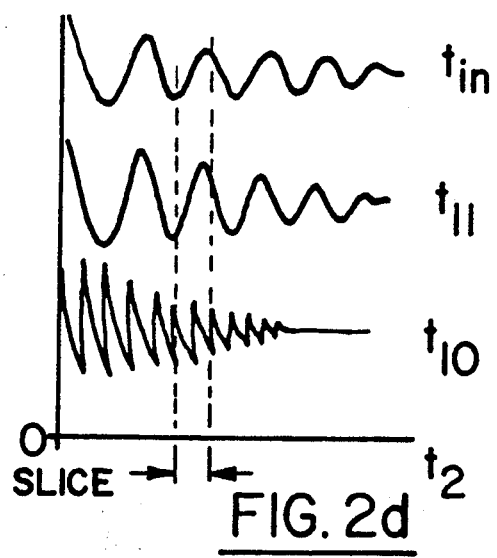

FIG. 3 shows both the 2D and 3D case. If 2D is selected, a slice which may be in one FID or may be through several FID's as shown in FIG. 2d, is used. The slices then progress through the FID's in successive loops through the program. If the 3D data is being processed, a plane in the third dimension for example, along F3 as shown on FIG. 9, is selected and the program proceeds with slices in each plane then each plane is successively processed. The successive processes are designated by the J:=J+1, the I:=I+1 and the K:=K+1, in FIG. 3. Each point in each plane or slice (the JTH) is processed by multiplying the FID data points with the JTH column of the A matrix. See expression 2 above for the A matrix which contains one dimension of frequencies in the frequency domain. Then the vector-vector product with the ITH point of the B matrix is obtained. The ITH column is the column rotated 90 degrees or transposed, as denoted by the capital letter T in expression (1). Direct transposition can be avoided by appropriate preparation of the B matrix (see above). This vector product is added to a matrix to provide the output matrix indicating the spectrum when all of the computations of each point, (all j and i points) is completed. In the event 3D is processed, these matrixes are then multiplied with the frequencies in each column of the C trigonometric matrix. The 3D spectrum then results.

It may be desirable in order to improve the signal to noise ratio of the FID data and complete certain phase incrementation steps in the pulse sequence, to run each dimension $t_1$, $t_2$ (in the case of 2D), and $t_1$, $t_2$, and $t_3$ in the case of $t_3$ for each point several times, during the acquisition, for example, 16 times, and then stack the FID data to provide the FID output which is then processed in the program illustrated in FIG. 3.

Figure 4:
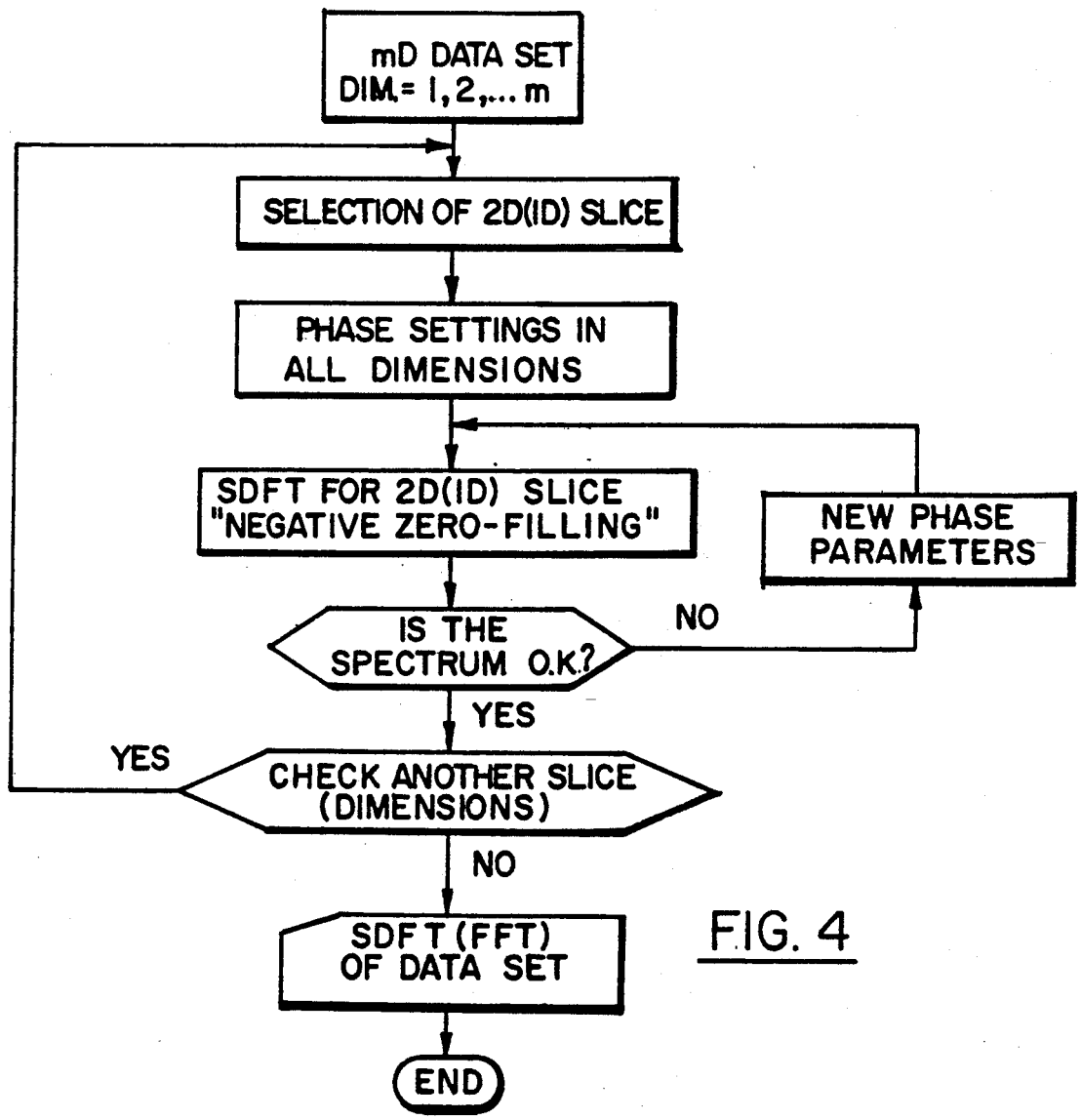
FIG. 4 is a flow chart illustrating the structure and format of a program including additional processes than the flow chart of FIG. 3 which may be used for optimizing the spectra generated by the system.

In order to set the phase of the t and i points in the frequency point matrixes rapidly the program shown in FIG. 4 may be used. The multidimensional (mD) data set in each of the dimensions which are shown generally as dim=1,2, . . . ,m is processed by the SDFT program examining only in a lower dimensional, typically a 2D or 1D slice of the data. However, all the phases are adjusted simultaneously. The above slice may be processed with lower digital resolution than as it is defined by the time domain data ("negative zero filling") to speed up the process using less data. The spectrum is then viewed on the display and the phase parameters are changed, if necessary. Other parameters, such as apodization parameters, may be adjusted in the same manner. After the spectrum in one slice is adjusted, another slice in another dimension of the FID data signals is similarly transformed to provide a spectrum which is then examined on the display. The parameters may be again reset to optimize the result. After sufficient number of checks of slices, the SDFT (or a conventional FFT) of the FID data set is carried out to produce the spectrum using the frequency domain, data in the matrixes as adjusted in phase, apodization or other characteristics before transformation. The transformation then produces the desired spectrum.

Referring the FIG. 5, examination of the acquired data as a spectrum in real time is obtained by applying appropriate SDFT processing for each FID (4 for phase sensitive 2D and 8 for full phase sensitive 3D, etc. The matrix vector products and vector-vector products in the case of 2D and vector matrix products in the case of 3D for each point are generated. The spectra corresponds to the matrix which is built up after each point in the region of interest has been computed. This matrix or array of data is then displayed with the display generator and display 36 (FIG. 1).

FIG. 6 shows a complete FFT spectrum which would require a large amount of computer resources to generate. The region in FIG. 8 shows the spectra is obtained for a region of interest containing a great deal of spectral information which is boxed in FIG. 6. By using SDFT identical if not higher resolution information is obtained without the need for such computer resources of SDFT provides results as good as shown in FIG. 7 or better than FFT, without the disadvantages of FFT discussed above.

By use of selected frequency point data (in the trigonometric matrixes), any slice in a 3D spectrum may be selected and displayed, either in two dimensions as shown in FIG. 9 or in three dimensions as shown in FIG. 10.

As shown in FIG. 11, NMR imaging data is analogous to spectral data which characterizes the different regions of the outline of a section of the brain of a patient as shown in FIG. 11. The boxed area showing a tumor is then indicated. The spectral information from the FIDs, where, for example, $t_1$, $t_2$, and $t_3$ correspond to the x, y, and z dimensional parameters of the data, may be analyzed using SDFT in accordance with this invention thereby providing high resolution images of a selected area of the patient in question.

Attached hereto as an appendix to this specification is the listing of the program, the format and structure of which is shown in FIG. 3. The program is written in Fortran and is for the 2D case.

From the foregoing description, it will be apparent that there has been provided improved magnetic residence systems useful for spectral analysis of chemical compositions as well as for imaging of physical structures, such as the human anatomy. Variations and modifications of the herein described system, within the scope of the invention, will undoubtedly suggest themselves to those skilled in the art. Accordingly the foregoing description should be taken as illustrative and not in a limiting sense.

We claim:

1. The method of generating multidimensional spectra from multiparameter magnetic resonance time domain signals which comprises the steps of selecting at least one region of the spectra of interest, generating from said time domain signals a plurality of sets of data signals corresponding to discrete frequency points along each dimension of at least one selected region of such spectra, and computing a discrete Fourier transform of said time domain signals and said data signals to provide said spectra in said selected region.

2. The method according to claim 1 further comprise the steps of generating certain of said frequency point data signals with values which are a function of the resolution of the spectra, filling certain points in said sets with said data signals of said predetermined value so that said sets contain said data signals corresponding to certain of said discrete frequency points and said predetermined data signals corresponding to frequency points between said certain points.

3. The method according to claim 1 where in said computing step is carried out by computing vector products of data signals corresponding to the values of said time domain signals at successive points in time with different ones of said signals which correspond to different frequency points, and adding said products to provide a matrix of said vector products which corresponds to said spectra of said selected region.

4. The method according to claim 3 where in said vector products computing step is carried out by computing a scalar-vector product of each of said successive points of said time domain signal and each of said points of said data signals corresponding to said frequency points along one of said dimensions and computing the vector product of each said scalar-vector product to provide points of said matrix.

5. The method according to claim 4 where in said dimensions of said multidimensional spectra are higher than two and said computing step is carried out by computing the vector matrix product of each of said points of said data signal corresponding to said frequency points of said higher dimension and the matrix product provided by said scalar-vector products and said vector-vector products to provide an output matrix corresponding to said spectra in all of said dimensions.

6. The method according to claim 1 further comprising adjusting the values of said data signals corresponding to said discrete frequency points to correct a predetermined characteristic of said spectra.

7. The method according to claim 6 where in said values are adjusted to adjust the phase of said data signals corresponding to said discrete frequency points.

8. The method according to claim 7 where in said computing step is carried out only with data signals corresponding to a predetermined number of said time domain signals sufficient to provide the general characteristics of said spectra, and then again carrying out said step of computing said discrete Fourier transform with second points of said time domain signals.

9. Apparatus for generating multidimensional spectra for multiparameter magnetic resonance time domain signals which comprises means for selecting at least one region of the spectra which is of interest, means for generating from said time domain signals a plurality of sets of data signals corresponding to discrete frequency points along each dimension of said selected region of said spectra, means for computing a discrete Fourier transform of said time domain signals and said data signals to provide said spectra in said selected region.

10. The apparatus according to claim 9 further comprising means for filling points in said sets with frequency point data signals having predetermined value so that said sets contain said data signals corresponding to certain of said discrete frequency points and said predetermined value data signals corresponding to frequency points between said certain points to control the resolution of said spectra in said region.

11. The apparatus according to claim 9 where-in said computing means comprises means for computing vector products of data signals corresponding to the values of said time domain signals at successive points in time with different ones of said data signals which correspond to different frequency points, and means for adding said products to provide a matrix of said vector products which corresponds to said spectra of said selected region.

12. The apparatus according to claim 11 where-in said means for computing said vector products comprises means for computing a scalar-vector product of each of said successive points of said time domain signal and each of said points of said data signals corresponding to said frequency points in one of said dimensions, and means for computing the vector product of each of said scalar-vector products to provide points of said matrix.

13. The apparatus according to claim 12 where in said dimensions of said multidimensional spectra are higher than two in number and said computing means comprising means for computing the vector matrix product of each of said data signals corresponding to said frequency points of said higher dimension and the matrix provided by scalar-vector products and said vector-vector products to provide an output matrix corresponding to said spectra.

14. The apparatus according to claim 9 further comprising means for adjusting the values of said data signals corresponding to said discrete frequency points to correct a predetermined characteristic of said spectra.

15. The apparatus according to claim 14 where-in said values are adjusted to adjust the phase of said data signals corresponding to said discrete frequency points.

16. The apparatus according to claim 15 where-in said computing means comprises means operative only on data signals corresponding to a predetermined number of said time domain signals so as to be sufficient to provide the general characteristics of said spectra, and means for computing said discrete Fourier transform with said predetermined number of said to rapidly enable the adjusting of said characteristic of said spectra time domain data signals.

* * * * *